United States Patent [19]

Matsumoto et al.

[11] Patent Number: 4,692,421

[45] Date of Patent: Sep. 8, 1987

[54] DIELECTRIC CERAMICS

[75] Inventors: Kazutoshi Matsumoto, Matsudo; Tetsuro Nakamura, Yokohama; Takehiro Hyuga, Ichikawa; Hiroshi Ichimura, Matsudo, all of Japan

[73] Assignee: Sumitomo Metal Mining Company Limited, Tokyo, Japan

[21] Appl. No.: 831,569

[22] Filed: Feb. 21, 1986

[30] Foreign Application Priority Data

Feb. 27, 1985 [JP] Japan ......................................... 35-38515

[51] Int. Cl.$^4$ .............................................. C04B 35/02
[52] U.S. Cl. .................................... 501/136; 501/135; 501/123
[58] Field of Search ........................ 501/123, 136, 135

[56] References Cited

U.S. PATENT DOCUMENTS 2,691,597 11/1954 Möllers ................................ 501/136
4,006,966 2/1977 Meyers et al. ....................... 429/188

FOREIGN PATENT DOCUMENTS 2437518 4/1975 Fed. Rep. of Germany ...... 501/136

Primary Examiner—William R. Dixon, Jr.
Assistant Examiner—Steven Capella
Attorney, Agent, or Firm—Watson, Cole, Grindle & Watson

[57] ABSTRACT

Dielectric ceramics represented by the following general formula and substantially having the $K_2NiF_4$ type crystal structure,

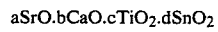

$aSrO \cdot bCaO \cdot cTiO_2 \cdot dSnO_2$ (wherein $0.39 \leq a \leq 0.70$, $0 \leq b \leq 0.28$, $0.27 \leq c \leq 0.35$, $0 \leq d \leq 0.04$, and $a+b+c+d=1$), have a high dielectric constant and an unloaded Q as high as 6000 and more in the high-frequency region of super high frequency band, and are therefore best suited for use in dielectric resonators, dielectric substrates for micro wave integrated circuit, and the like.

3 Claims, No Drawings

DIELECTRIC CERAMICS

BACKGROUND OF THE INVENTION

1. Field of the Invention

This invention relates to dielectric ceramics. More particularly, it relates to dielectric ceramics which have an exceptionally high dielectric constant, which show a high unloaded Q even in the high-frequency region of the SHF (super high frequency) band, and which are hence suited for high-frequency applications.

2. Description of the Prior Art

It is generally required that the dielectric ceramic materials used for dielectric resonators and substrates in signal circuits for high-frequency regions, such as microwave and millimeter wave bands, should have a high dielectric constant and a high unloaded Q. The tendency toward higher frequency is increasingly marked in recent years in telecommunication systems, and satellite broadcasting using SHF band is now coming into its own. Under the circumstances, there has been a strong demand for low-loss dielectric materials having a far higher unloaded Q. To be more specific, there is a demand for dielectric materials which have a dielectric constant as low as 30 to 100 and show an unloaded Q of 6000 or greater in the SHF band.

Dielectric ceramic materials conventionally used for high-frequency applications are those of $TiO_2$ system—for example, $BaO$-$TiO_2$ type materials (Japanese Patent Application Laid-Open No.61668, 1982), $ZrO_2$-$SnO_2$-$TiO_2$ type materials (Japanese Patent Application Laid-Open No.38100, 1976) and $MgO$-$CaO$-$La_2O_3$-$TiO_2$ type materials (Japanese Patent Application Laid-Open No.49964, 1975)—particularly those having the Perovskite structure. In addition, dielectric ceramic materials of the complex Perovskite structure, such as $Ba(Zn_{\frac{1}{3}}Ta_{\frac{2}{3}})O_3$ (Japanese Patent Application Laid-Open No.35454, 1978) and $Ba(Mg_{\frac{1}{3}}Ta_{\frac{2}{3}})O_3$ (Japanese Patent Application Laid-Open No.206003, 1983), have also been proposed in recent years. However, any of these fails to meet the requirements mentioned above because the unloaded Q in the SHF region under consideration (especially in the X band) is smaller than 5000, or the dielectric constant is less than 30.

SUMMARY OF THE INVENTION

The object of this invention is to provide dielectric ceramics having a high dielectric constant and showing a high unloaded Q even in the SHF band, particularly in the high-frequency region of X band—the properties which cannot be achieved by conventional ceramic materials.

DETAILED DESCRIPTION OF THE INVENTION

The above-mentioned object can be achieved by the new dielectric ceramics represented by the following general formula (I) and substantially having the $K_2NiF_4$ type crystal structure, $$aSrO.bCaO.cTiO_2.dSnO_2 \quad (I)$$

wherein $0.39 \leq a \leq 0.70$, $0 \leq b \leq 0.28$, $0.27 \leq c \leq 0.35$, $0 \leq d \leq 0.04$, and $a+b+c+d=1$.

The values of a, b, c and d in formula (I) dictate the dielectric characteristics of a particular dielectric material while correllating with each other, and it is therefore difficult to independently discuss the effect of each. However, the general tendency is that unloaded Q is too small when a is less than 0.39, and unloaded Q and dielectric constant are both excessively small when a exceeds 0.70; dielectric constant is too small when c is less than 0.27, and unloaded Q is too small when c exceeds 0.35 although dielectric constant increases; and unloaed Q is too small when c exceeds 0.28 or d exceeds 0.04. The sum (a+b) should preferably be in the range from 0.65 to 0.70. If this value is less than 0.65 or exceeds 0.70, dielectric constant may be lower than 30 or unloaded Q may be smaller than 6000 in some cases.

There is no specific limitation upon the manufacturing process for the dielectric ceramics of this invention, and any commonly adopted methods may be used for this purpose, for example, sintering a compression-molded product with a desired material composition at a temperature in the range from about 1200° C. to about 1600° C. The compression-molded products to be sintered are made by known techniques, for example, by mixing powder of raw materials (e.g., strontium carbonate, calcium carbonate, titanium oxide and tin oxide) in such a proportion as to give final products of desired composition, calcining the powdery mixture to convert all the raw materials into oxides, and molding the calcined product under pressure. The compression-molded products thus obtained should preferably be sintered in an inert gas atmosphere (e.g., nitrogen or argon gases) or in an oxidizing gas atmosphere (e.g., air or oxygen gas).

Unlike conventional dielectric ceramics for high-frequency applications which fail to meet the two characteristics requirements mentioned above (dielectric constant and unloaded Q in the high-frequency region of SHF band), the dielectric ceramics of this invention have a high dielectic constant and an unloaded Q as high as 6000 and more in that region, and are therefore best suited for use in dielectric resonators, dielectric substrates for micro wave integrated circuit, and the like.

The following examples will further illustrate this invention but are not intended to limit its scope.

EXAMPLE 1

Dielectric ceramics containing, as metal element, only strontium and titanium and having compositions listed in Table 1 were prepared as described below (Experimental No.1 through 11, in which No.1 and No.11 provide comparative examples).

Suitable amounts of strontium carbonate and titanium dioxide, both 99.9% in purity, were weighed so as to give final products having the compositions listed in Table 1, and the powder was subjected to wet mixing for 16 hours in the presence water using a polyethylene pot and resincoated balls. The mixture was taken out from the pot, dried at 150° C. for five hours, and compression-molded into lumps under a pressure of 700 Kg/cm². The lumps were calcined in air at 1100° C. for two hours, crushed in an alumina mortar, and passed through a 42-mesh sieve. The powder thus obtained was molded into disks 10 mm in diameter and about 5 mm in thickness under a pressure of 500 Kg/cm², and the disks thus prepared were then compressed under an isostactic pressure of 2000 Kg/cm², giving molded products. These were then sintered at 1550° C. for four hours in air or in an oxygen atmosphere, affording final ceramic products. Dielectric constant ($\epsilon_r$) and unloaded Q ($Q_u$) of the ceramics thus obtained were measured by the dielectric resonator method at a frequency in the vicinity of 9 GHz, the result of which is summarized in Table 1.

TABLE 1

| Exp. No.[1] | Ceramics composition (aSrO.cTiO$_2$)[2] | | Sintering Atmosphere[3] | (Measurements) | |
| --- | --- | --- | --- | --- | --- |
| | (a) | (c) | | ($\epsilon_r$) | ($Q_u$) |
| *1 | 0.64 | 0.36 | Air | 42.1 | 4400 |
| 2 | 0.65 | 0.35 | Air | 40.4 | 8000 |
| 3 | 0.66 | 0.34 | Air | 38.6 | 9700 |
| 4 | 0.66 | 0.34 | Oxygen | 39.0 | 9800 |
| 5 | 0.67 | 0.33 | Air | 37.9 | 11700 |
| 6 | 0.67 | 0.33 | Oxygen | 38.3 | 13700 |
| 7 | 0.68 | 0.32 | Air | 34.9 | 11000 |
| 8 | 0.68 | 0.32 | Oxygen | 35.2 | 12100 |
| 9 | 0.69 | 0.31 | Air | 33.1 | 10200 |
| 10 | 0.70 | 0.30 | Air | 31.0 | 8300 |
| *11 | 0.71 | 0.29 | Air | 28.3 | 5700 |

Notes:
[1]Mark *indicates comparative example.
[2]a + c = 1
[3]Sintering time: Four hours for all Sintering temperature: 1550° C. for all

EXAMPLE 2

Dielectric ceramics having compositions listed in Table 2 were prepared using strontium carbonate, calcium carbonate, titanium dioxide and tin dioxide (99.9% purity for all) in the same manner as Example 1 (Experimental No.12 through 15). Dielectric constant ($\epsilon_r$) and unloaded Q ($Q_u$) of the ceramics thus obtained were measured at a frequency in the vicinity of 9 GHz in the same way as in Example 1, the result of which is summarized in Table 2.

TABLE 2

| Exp. No. | Ceramic Composition (aSrO.bCaO.cTiO$_2$.dSnO$_2$)[1] | | | | Sintering Atmosphere[2] | (Measurements) | |
| --- | --- | --- | --- | --- | --- | --- | --- |
| | (a) | (b) | (c) | (d) | | ($\epsilon_r$) | ($Q_u$) |
| 12 | 0.47 | 0.20 | 0.33 | 0 | Oxygen | 41.5 | 7100 |
| 13 | 0.63 | 0.04 | 0.33 | 0 | Oxygen | 37.4 | 11800 |
| 14 | 0.63 | 0.03 | 0.32 | 0.02 | Air | 37.4 | 8300 |
| 15 | 0.66 | 0 | 0.32 | 0.02 | Oxygen | 37.5 | 6700 |

Notes:
[1]a + b + c + d = 1
[2]Sintering time: Four hours for all Sintering temperature: 1550° C. for all

What is claimed is:

1. Dielectric ceramics which substantially have a K$_2$NiF$_4$-type crystal structure and which display an unloaded Q value of 6000 or greater, said dielecrtic ceramics having the formula:

aSrO.bCaO.cTiO$_2$.dSnO$_2$ wherein $0.39 \leq a \leq 0.70$, $0 \leq b \leq 0.28$, $0.27 \leq c \leq 0.35$, $0 \leq d \leq 0.04$, $0.65 \leq a+b \leq 0.70$, and $a+b+c+d=1$.

2. The dielectric ceramics as defined in claim 1, wherein molded products having a composition as specified above are sintered at a temperature in the range from 1200° to 1600° C.

3. The dielectric ceramics as defined in claim 2, wherein said sintering of molded products is conducted in an inert gas atmosphere or in an oxidizing gas atmosphere.

* * * * *